US 9,431,621 B2

(12) United States Patent
Forrest et al.

(10) Patent No.: US 9,431,621 B2
(45) Date of Patent: Aug. 30, 2016

(54) METAL OXIDE CHARGE TRANSPORT MATERIAL DOPED WITH ORGANIC MOLECULES

(75) Inventors: Stephen R. Forrest, Ann Arbor, MI (US); Brian E. Lassiter, Ypsilanti, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 0 days.

(21) Appl. No.: 13/418,875

(22) Filed: Mar. 13, 2012

(65) Prior Publication Data
US 2013/0240840 A1 Sep. 19, 2013

(51) Int. Cl.
*H01L 29/08* (2006.01)
*H01L 21/00* (2006.01)
*H01L 51/42* (2006.01)
*H01L 51/00* (2006.01)

(52) U.S. Cl.
CPC ......... *H01L 51/4253* (2013.01); *H01L 51/0072* (2013.01); *H01L 51/0078* (2013.01); *Y02E 10/549* (2013.01)

(58) Field of Classification Search
CPC ..... H01L 25/048; H01L 27/288; H01L 27/30; H01L 27/32; H01L 27/3239; H01L 31/143; H01L 31/162; H01L 33/06; H01L 33/08; H01L 33/18; H01L 33/24; H01L 33/26; H01L 51/0032; H01L 51/50; H01L 51/05
USPC ............... 257/13, 79–103, 918, 40, 642–643, 257/759; 438/22–47, 69, 493, 503, 507, 438/956
See application file for complete search history.

(56) References Cited

U.S. PATENT DOCUMENTS

| | | | |
|---|---|---|---|
| 5,885,368 A | 3/1999 | Lupo et al. | |
| 5,917,280 A | 6/1999 | Burrows et al. | |
| 6,198,091 B1 | 3/2001 | Forrest et al. | |
| 6,614,176 B2 | 9/2003 | Kim et al. | |
| 7,592,539 B2 | 9/2009 | Peumans et al. | |
| 8,021,763 B2 | 9/2011 | Kanno et al. | |
| 2005/0221121 A1 | 10/2005 | Ishihara et al. | |
| 2006/0060239 A1* | 3/2006 | Peumans et al. | ............... 136/263 |
| 2007/0043222 A1 | 2/2007 | Yoshimoto et al. | |
| 2008/0054783 A1 | 3/2008 | Xia | |
| 2008/0176154 A1* | 7/2008 | Gyoutoku | .................... 430/58.1 |
| 2009/0261713 A1* | 10/2009 | Choi et al. | .................... 313/504 |
| 2010/0025665 A1* | 2/2010 | Rand et al. | ...................... 257/40 |

(Continued)

FOREIGN PATENT DOCUMENTS

WO    2009070534 A1    6/2009

OTHER PUBLICATIONS

Qi et al, "Analysis of metal-oxide-based charge generation layers used in stacked organic light-emitting diodes", J. Appl. Phys. 107, 014514-1 (2010).

(Continued)

*Primary Examiner* — Selim Ahmed
*Assistant Examiner* — Moin Rahman
(74) *Attorney, Agent, or Firm* — Duane Morris LLP

(57) ABSTRACT

Doping metal oxide charge transport material with an organic molecule lowers electrical resistance while maintaining transparency and thus is optimal for use as charge transport materials in various organic optoelectronic devices such as organic photovoltaic devices and organic light emitting devices.

34 Claims, 6 Drawing Sheets

(56) References Cited

U.S. PATENT DOCUMENTS

| | | | |
|---|---|---|---|
| 2010/0132770 A1 | 6/2010 | Beatty et al. | |
| 2010/0289008 A1* | 11/2010 | Jang et al. | 257/40 |
| 2010/0294351 A1* | 11/2010 | Holmes et al. | 136/255 |
| 2011/0012091 A1* | 1/2011 | Forrest | B82Y 10/00 257/40 |
| 2011/0079273 A1 | 4/2011 | Arango et al. | |

OTHER PUBLICATIONS

Ha et al, "Molecular-scale properties of MoO3-doped pentacene", Physical Review B82, 155434 (2010), pp. 1-7.

Kanno et al, "White Stacked Electrophosphorescent Organic Light-Emitting Devices Employing MoO3 as a Charge-Generation Layer", Adv. Mater. 2006, 18, pp. 339-342.

Timmreck et al, "Highly doped layers as efficient electron-hole recombination contacts for tandem organic solar cells". J. Appl. Phys. 108, 033108 (2010).

Qiu et al, "MoO3 doped 4,4-N,N-dicarbazole-biphenyl for low voltage organic light emitting diodes", Appl. Phys. Lett. 99, 153305 (2011).

Zhang et al, "Controllable Molecular Doping and Charge Transport in Solution-Processed Polymer Semiconducting Layers", Adv. Funct. Mater. 2009, 19, 1901-1905.

Gebeyehu et al, "Influence of Doped-Charge Transport Layers on the Photovoltaic Performance of Donor-Acceptor Blend p-i-n Type Organic Solar Cells", Bull. Chem. Soc. Ethiop. 2004, 18(1), 101-109.

Greiner, et al "Universal energy-level alignment of molecules on metal oxides", Nature Materials, vol. 11, Jan. 2012, pp. 76-81.

Kahn, et al "Electronic Structure and Electrical Properties of Interfaces between Metals and π-Conjugated Molecular Films", Journal of Polymer Science: Part B: Polymer Physics, vol. 41, 2529-2548 (2003), pp. 2529-2548.

International Search Report and Written Opinion of corresponding International Application No. PCT/US2013/029305 filed Mar. 6, 2013.

* cited by examiner

METAL OXIDE CHARGE TRANSPORT MATERIAL DOPED WITH ORGANIC MOLECULES

GOVERNMENT RIGHTS

This invention was made with government support under DE-SC0000957 and DE-FG36-08GO18022 awarded by the U.S. Department of Energy and FA9550-10-1-0339 awarded by the Air Force Office of Scientific Research. The government has certain rights in the invention.

JOINT RESEARCH AGREEMENT

The claimed invention was made by, on behalf of, and/or in connection with one or more of the following parties to a joint university-corporation research agreement(s): Regents of the University of Michigan, Princeton University, University of Southern California, Global Photonic Energy Corporation and/or Universal Display Corporation. The agreement(s) was in effect on and before the date the claimed invention was made, and the claimed invention was made as a result of activities undertaken within the scope of the agreement(s).

TECHNICAL FIELD

The present disclosure relates to the field of organic semiconductors and more particularly to organic films for use in organic electronic devices.

BACKGROUND

Optoelectronic devices rely on the optical and electronic properties of materials to either produce or detect electromagnetic radiation electronically or to generate electricity from ambient electromagnetic radiation. Optoelectronic devices that make use of organic semiconductor materials are becoming more desirable because of their potential for cost advantage over inorganic semiconductor materials and certain beneficial inherent properties organic materials, such as their flexibility.

Photosensitive optoelectronic devices convert electromagnetic radiation into an electrical signal or electricity. Solar cells, also called photovoltaic ("PV") devices, are a type of photosensitive optoelectronic devices that are specifically used to generate electrical power. An organic photosensitive device comprises at least one photoactive region in which light is absorbed to form an exciton, which may subsequently dissociate into an electron and a hole. The photoactive region will typically comprise a donor-acceptor heterojunction, and is a portion of a photosensitive device that absorbs electromagnetic radiation to generate excitons that may dissociate in order to generate an electrical current. The donor-acceptor heterojunction can be a planar heterojunction, bulk heterojunction, or hybridized mixed-planar heterojunction. A hybridized mixed-planar heterojunction comprises a first organic layer comprising a mixture of an organic acceptor material and an organic donor material; and a second organic layer comprising an unmixed layer of the organic acceptor material or the organic donor material of the first organic layer. Such hybridized mixed-planar heterojunction is described in United States patent application Publication No. 2005/0224113 of Xue, et al., published on Oct. 13, 2005, the contents of which are incorporated herein by reference in its entirety.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. Charge recombination zones are described, for example, in U.S. Pat. No. 6,657,378 to Forrest et al.; Published U.S. Patent Application 2006-0032529 A1, entitled "Organic Photosensitive Devices" by Rand et al., published Feb. 16, 2006; and Published U.S. Patent Application 2006-0027802 A1, entitled "Stacked Organic Photosensitive Devices" by Forrest et al., published Feb. 9, 2006; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

For additional background explanation and description of the state of the art for organic photosensitive devices, including their general construction, characteristics, materials, and features, U.S. Pat. Nos. 6,972,431, 6,657,378 and 6,580,027 to Forrest et al., and U.S. Pat. No. 6,352,777 to Bulovic et al., are incorporated herein by reference in their entireties.

In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the HOMO and LUMO energy levels of one material in contact with another are lower, then that material is an acceptor. If the HOMO and LUMO energy levels of one material in contact with another are higher, then that material is a donor. It is energetically favorable, in the absence of an external bias, for electrons at a donor-acceptor junction to move into the acceptor material.

As used herein, a first HOMO or LUMO energy level is "higher than" a second HOMO or LUMO energy level if the first energy level is closer to the vacuum energy level and the first HOMO or LUMO energy level is "lower than" a second HOMO or LUMO energy level if the first energy level is further away from the vacuum energy level. A higher HOMO energy level corresponds to an ionization potential having a smaller absolute energy relative to a vacuum level. Similarly, a higher LUMO energy level corresponds to an electron affinity having a smaller absolute energy relative to vacuum level. On a conventional energy level diagram, with the vacuum level at the top, the LUMO energy level of a material is higher than the HOMO energy level of the same material.

A significant property in organic semiconductors is carrier mobility. Mobility measures the ease with which a charge carrier can move through a conducting material in response to an electric field. In the context of organic photosensitive devices, a material that conducts preferentially by electrons due to high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer. A layer that conducts preferentially by holes, due to mobility and/or position in the device, may be referred to as a hole transport layer. Preferably, but not necessarily, an acceptor material is an electron transport material and a donor material is a hole transport material.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substitute does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

An example of organic optoelectronic devices that produce electromagnetic radiation electronically include organic light emitting devices (OLEDs). OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, the disclosures of which are incorporated herein by reference in their entireties.

OLED devices are often configured to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated herein by reference in their entireties, may also be used. For a device intended to emit light only through the bottom electrode, the top electrode does not need to be transparent, and may include a thick and reflective metal layer having a high electrical conductivity. Similarly, for a device intended to emit light only through the top electrode, the bottom electrode may be opaque and/or reflective. This is because, where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent.

In many color display applications, three OLEDs, each emitting light of one of the three primary colors, blue, green and red, are arranged in a stack, thereby forming a color pixel from which any color can be emitted. Examples of such stacked OLED ("SOLED") structures can be found described in PCT International Application WO 96/19792 and U.S. Pat. No. 6,917,280, the disclosures of which are incorporated herein by reference in their entireties.

In such a stacked structure, a pair of electrode layers are provided, one at the bottom and another at the top of the SOLED stack. In one variation of SOLEDs, an intermediate electrode layer that is externally connected can be provided between each of the OLED units in the stack. In other variations of SOLEDs, a charge generating layer ("CGL") that injects charge carriers but without direct external electrical connection is provided between each of the OLED units in the stack.

As used herein, "top" means furthest away from the optoelectronic device's substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate but not necessarily in physical contact with the second layer. There may be one or more other layers between the first and second layers, unless it is specified that the first layer is "in physical contact with" the second layer. For example, a cathode may be described as being "disposed over" an anode, even though there are various layers in between.

SUMMARY

The present disclosure provides a charge transport material for use in an optoelectronic device comprising a metal oxide doped with an organic compound. According to an embodiment of the present disclosure, some examples of the organic material for doping are 2,3,5,6-tetrafluoro-7,7,8,8-tetracyanoquinodimethane ($F_4$TCNQ), acridine orange base (AOB), and chloroboron subphthalocyanine (SubPc).

According to another embodiment, an optoelectronic device incorporating such charge transport material is disclosed. Such device can be a photosensitive device comprising a first electrode, a second electrode, a photoactive region disposed between the first electrode and the second electrode and electrically connected to the first and second electrodes, and a charge transport layer disposed between the photoactive region and at least one of the first and second electrodes, wherein the charge transport layer comprises a metal oxide material that is doped with an organic dopant material.

The metal oxide material doped with organic compounds having decreased resistivity can be used as either a hole-transport layer ("HTL"), an electron transport layer ("ETL"), or both, in organic photovoltaic devices ("OPV"). The metal oxide material can also be used as a recombination zone in tandem OPVs, or as charge transport layers in OLEDs or CGLs in SOLEDs.

According to an embodiment, an OLED comprises an anode, a cathode, and at least one emissive layer and at least one charge transport layer disposed between the anode and the cathode. In this embodiment, the at least one charge transport layer comprises a metal oxide material doped with an organic dopant material.

In another embodiment, a SOLED comprises an anode, a cathode, a plurality of emissive regions disposed between the anode and the cathode, and a CGL disposed between successive emissive regions. In this embodiment, the CGL comprises a metal oxide material doped with an organic dopant material.

The present invention also provides a method of making the disclosed charge transport material for use in an optoelectronic device comprising a metal oxide and an organic dopant material. Examples of making such doped metal oxide compositions include vacuum thermal evaporation, solution deposition, spin casting, spray coating, doctor-blading, and other solution processing techniques.

Figure 1:
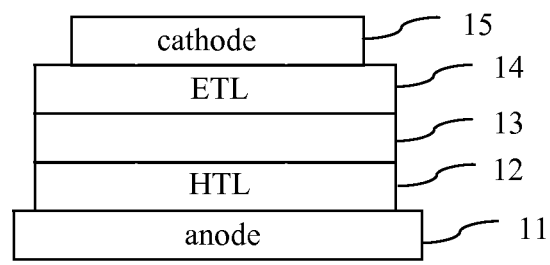
FIG. 1 is a cross-sectional view of an organic photovoltaic device according to an embodiment.

Except where noted otherwise, all drawings are schematic and are not drawn to scale and are not intended to necessarily convey actual dimensions.

DETAILED DESCRIPTION

New metal oxide charge transport materials doped with organic molecules to increase the conductivity of the metal oxide thin films is disclosed. The resulting charge transport material exhibit increased conductivity, optical transparency, light absorption, and chemical resistance suitable for optoelectronic devices. They can be used for either a HTL, an ETL, or both, in an OPV device or OLED devices. Other applications of the disclosed composition include uses as a recombination zone in tandem OPVs, or as a charge generation layers in SOLEDs.

As described herein, "metal oxide" may be any transition metal oxide which have favorable energy level alignment, electric conductivity, optical transparency, and chemical robustness. The metal oxides are suitable as charge transport layers in organic and molecular electronics. They may have abilities to provide good energy level alignment with a wide range of materials to improve carrier injection and extraction. Their optical transparency may allow their use as optical spacers. They are compatible with a wide range of deposition processes such as vacuum evaporation, solution deposition, spin casting, spray coating, doctor-blading, and other solution processing techniques. They also have chemical resistance allowing the subsequent solvent-based deposition of subsequent layers. Examples of the metal oxide material include $MoO_3$, $CrO_3$, $V_2O_5$, $WO_3$, NiO, $Cr_3O_4$, $Cr_2O_3$, CuO, $RuO_2$, $TiO_2$, $Ta_2O_5$, $SnO_2$, $Cu_2O$, and other transition metal oxide. A transition metal oxide having high electrical conductivity, optical transparency and chemical robustness is preferred.

The organic dopant as described herein may be an organic semiconducting material, which have suitable energy alignment with the metal oxide host described above. The organic dopant may exist in the form of small molecules, oligomers or polymers. The small molecules are preferred. Examples of such small molecule organic dopant include 2,3,5,6-tetrafluoro-7,7,8,8-tetracyanoquinodimethane ($F_4TCNQ$), acridine orange base (AOB) and chloroboron subphthalocyanine (SubPc).

An organic dopant can be selected to provide either n-type doping or p-type doping based on the following principles. When the HOMO of the dopant is similar to or smaller than (i.e., closer to the vacuum energy level) the LUMO of the metal oxide host, n-type doping occurs. Conversely, when the LUMO of the dopant is similar to or larger (i.e., further from the vacuum energy level) than the HOMO of the host, p-type doping occurs. As used herein, "similar to" means within ~5 kT, or 0.2 eV.

For example, a wide range of organic materials can be used for n-type doping because the LUMO of $MoO_3$ is very high (~6 eV). Examples of suitable organic dopants for n-type doping of $MoO_3$ include: acridine orange base (AOB) (~3 eV), pentacene (5.0 eV), tetracene (5.2 eV), copper phthalocyanine (CuPc) (5.2 eV), N,N'-Bis(naphthalen-1-yl)-N,N'-bis(phenyl)-benzidine (NPD) (5.3 eV), diindenoperylene (DIP) (5.5 eV), chloroboron subphthalocyanine (SubPc) (5.6 eV), and tris(8-hydroxyquinolinato) aluminium (Alq3) (5.8 eV).

This n-type doping also applies to other metal oxides with similar energy levels such as $CrO_3$, $V_2O_5$, and $WO_3$. Acridine orange base (AOB) having low HOMO (~3 eV) may act as an n-type dopant for a wide range of metal oxides, including $MoO_3$, $CrO_3$, $V_2O_5$, $WO_3$, NiO, $Cr_3O_4$, $Cr_2O_3$, CuO, $RuO_2$, $TiO_2$, $Ta_2O_5$, $SnO_2$, and $Cu_2O$. For the metal oxides with smaller HOMO levels such as CuO at −5.2 eV, organic molecules such as $F_4TCNQ$, whose LUMO level is −5.2 eV is suitable as a p-type dopant.

The HOMO/LUMO levels of various transition-metal oxides such as $MoO_3$, $CrO_3$, $V_2O_5$, $WO_3$, NiO, $Co_3O_4$, $MoO_2$, $Cr_2O_3$, CuO, $TiO_2$, $Ta_2O_5$, $Cu_2O$, and CoO are provided in Greiner et al., "Universal energy-level alignment of molecules on metal oxides," NATURE MATERIALS, Vol. 11, (January 2012), the disclosure of which is incorporated herein by reference in its entirety. The HOMO/LUMO levels of organic materials $F_4$-TCNQ, NTCDA, TCNQ, PTCDA, BCP, CBP, $F_{16}$—CuPC, PTCBI, Alq3, α-NPD, CuPC, ZnPC, Pentacene, and α-6T are provided in Kahn et al., "Electronic Structure and Electrical Properties of Interfaces between Metals and π-Conjugated Molecular Films," JOUR. OF POLY. SCI.: PART B: POLYMER PHYSICS, Vol. 41, 2529-2548 (2003), the disclosure of which is incorporated herein by reference in its entirety.

The organic dopant may be introduced into the metal oxide host through a gas, solution or solid processing technique. Examples of making such doped metal oxide composition include vacuum thermal evaporation, solution deposition, spin casting, spray coating, doctor-blading, and other solution processing techniques. As for doping of metal oxide films deposited from solution with organic molecules, a solvent in which both materials are soluble or dispersed, is chosen. The organic dopant is about 1 to 20 vol. %, more preferably 5-10 vol. %, of the whole composition.

The benefits of the doped metal oxide charge transport materials were verified by the inventors using the specific examples of $MoO_3$ doped with 2,3,5,6-tetrafluoro-7,7,8,8-tetracyanoquinodimethane ($F_4TCNQ$) or acridine orange base (AOB). With both dopants, the resulting materials have a significantly reduced electrical resistivity while still maintaining transparency of the charge transport material. Because of their high resistance, undoped metal oxides are generally limited for use in very thin film (<20 nm) applications. But, the organic molecule doped metal oxides according to the present disclosure are suitable as charge transport material for applications requiring charge transport layers of 150 nm or even higher in thickness.

According to an embodiment, an organic photosensitive device is disclosed. The device comprises a first electrode, a second electrode, a photoactive region disposed between the first electrode and the second electrode, and a charge transport layer disposed between the photoactive region and at least one of the first and second electrodes, wherein the charge transport layer comprises a metal oxide host material that is doped with an organic dopant material.

FIG. 1 shows an example of an OPV device 10 according to an embodiment of the present disclosure. The device 10 comprises an anode 11 (e.g. ITO), a cathode 15, and a photoactive region 13 disposed between the two electrodes. The OPV device 10 can further include a charge transport layer 12, 14 disposed between the photoactive region 13 and at least one of the two electrodes 11, 15, where the charge transport layer comprises a metal oxide material doped with an organic dopant material. The charge transport layer 12 disposed between the photoactive region 13 and the anode 11 is a HTL and the charge transport layer 14 disposed between the photoactive region 13 and the cathode 15 is an ETL. The photoactive region 13 generally includes at least one organic electron donor material and at least one organic electron acceptor material that form a donor-acceptor heterojunction. Various types of donor-acceptor heterojunctions are possible as described herein.

Figure 2:
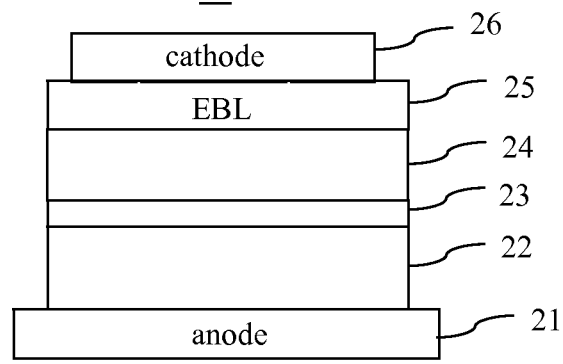
FIG. 2 is a cross-sectional view of an organic photovoltaic device according to another embodiment.

FIG. 2 shows another example of an OPV device 20 according to another embodiment. The OPV device 20 is a tandem device and can comprise an anode 21, a cathode 26 and multiple photoactive subcells 22, 24 provided in series between the two electrodes. Each of the subcells 22, 24 can comprise at least one organic electron donor material and at least one organic electron acceptor material that form a donor-acceptor heterojunction in the subcell. A thin layer of electron-hole recombination zone 23 is provided between the individual subcells separating the subcells. According to the present disclosure, the electron-hole recombination zone 23 comprises a metal oxide material doped with an organic dopant material. The recombination zone 23 serves to prevent the formation of an inverse heterojunction between the acceptor material of the anode-side subcell and the donor material of the cathode-side subcell. The recombination zone allows the electrons approaching from the anode-side subcell and the holes approaching from the cathode-side subcell to recombine.

Another application of the charge transport material of the present disclosure is in organic light emitting devices (OLEDs). In one embodiment, the metal oxide material doped with organic molecules can be used as one or both types of the charge transport layers in OLEDs. In other words, the novel charge transport material can be used for hole transport layers and/or electron transport layers in OLEDs.

Figure 3:
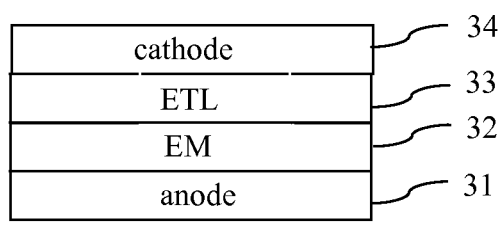
FIG. 3 is a cross-sectional view of a two layer organic light emitting device.
Figure 4:
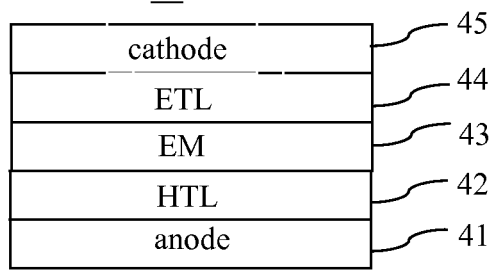
FIG. 4 is a cross-sectional view of a three layer organic light emitting device.

FIG. 3 shows an example of a two-layer OLED 30 comprising an emissive layer 32 and an electron transport layer 33 disposed in between two electrodes, an anode 31 and a cathode 34. According to an embodiment, the electron transport layer 33 can comprise the metal oxide doped with organic molecules. FIG. 4 shows an example of a three-layer OLED 40 comprising an emissive layer 43, a hole transport layer 42, and an electron transport layer 44 that are disposed in between an anode 41 and a cathode 44. According to another embodiment, one or both of the charge transport layers 44 and 42 can comprise the metal oxide doped with organic molecules. Various methods of fabricating OLEDs having these architecture are known to those skilled in the art.

Another application of the charge transport material of the present disclosure is in stacked light emitting devices (SOLEDs), where multiple active layers are combined monolithically. In SOLEDs, two or more individual emissive regions are stacked in vertical arrangement, the successive emissive regions being separated by an intermediate layer. The intermediate layers are also referred to as charge generation layers (CGLs) because of their charge carrier generating or injecting function in the device. A CGL is a layer that injects charge carriers but does not have direct external electrical connection. When a voltage is applied across the SOLED, the CGLs inject holes into the emissive region on the cathode side of the CGL, and electrons into the emissive region on the anode side of the CGL.

Figure 5:
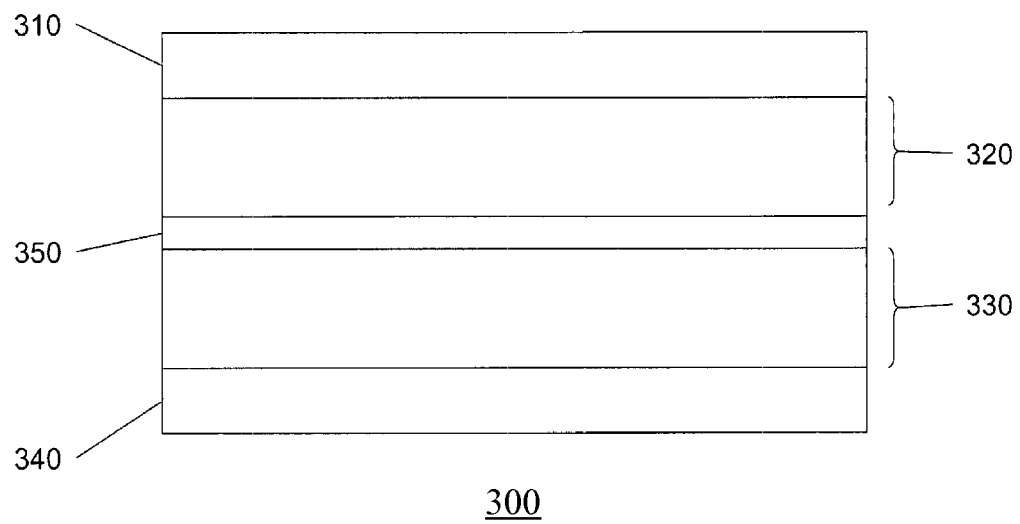
FIG. 5 is a cross-sectional view of a stacked organic light emitting device.

FIG. 5 shows an example of a SOLED 300 having two emissive regions. The SOLED 300 comprises an anode 310, two organic emissive regions 320 and 330, a CGL 350, and a cathode 340. Organic emissive regions 320 and 330 can comprise multiple layers, such as hole injection layers, electron injection layers, and emissive layers. As will be appreciated by one skilled in the art, the emissive regions can include other layers such as electron blocking layers, hole blocking layer, etc. The CGL 350 is disposed between the two emissive regions 320 and 330. In a preferred embodiment, the CGL 350 comprises a metal oxides material doped with organic molecules described herein. When voltage is applied across the device, the CGL 350 may inject holes into the emissive region 330 and electrons into the emissive region 320. Due to the charge carrier injection properties of the CGL 350, the device 300 may have improved efficiencies.

In one embodiment of such SOLEDs, a CGL consisting of doped organic/$MoO_3$ has been used by Kanno et al. (Adv. Mater. 18, 339-342 (2006)). When voltage is applied to the device, the CGL generates an electron on the organic side and a hole on the $MoO_3$ side, which then contribute to light emission. As this process is dependent on the availability of free charges (Qi et al. J. Appl. Phys. 107, 014514 (2010)), it is likely that doping the $MoO_3$ layer with an organic molecule, thereby increasing the free charge density, would lead to improved performance.

In another embodiment, the OLEDs and SOLEDs described above are phosphorescent organic light emitting devices ("PHOLED") that utilize emissive materials that emit light from triplet states ("phosphorescence"). But the improved charge transport material of the present disclosure can be applied to PHOLEDs as well as fluorescent OLEDs. The organic emissive materials for PHOLEDs and fluorescent OLEDs are known in the art.

EXAMPLES

Specific representative embodiments of the invention is now described. It is understood that the specific methods, materials, conditions, process parameters, apparatus and the like are merely examples and do not necessarily limit the scope of the invention.

Experimental Methods:

The inventors prepared and tested examples of OPV devices according to the following experimental procedures. Substrates consisting of indium tin oxide-coated glass ("ITO") (150 nm, <15Ω, Prazisions Glas & Optik GmbH) quartz (qtz), or silicon were cleaned sequentially in Tergitol, deionized water, acetone, trichloroethylene, acetone, and isopropanol. $C_{60}$ (MER, 99.9% sublimed) and AOB (Aldrich, 75%) were purified once and SubPc (Aldrich, 85%) was purified three times by thermal gradient sublimation at $<1\times10^{-7}$ Torr. Other materials were used as received. The ITO substrates were subjected to a UV-ozone treatment for 600 seconds and transferred into a nitrogen glovebox with <0.1 ppm $O_2$ and $H_2O$. The substrates were loaded into a high-vacuum chamber with base pressure $<1.0\times10^{-6}$ Torr. The metal oxide host and organic dopant materials were evaporated at 0.10 nm/s. Squaraine films were deposited from solution via spin coating in a nitrogen environment. All rates were measured by quartz crystal monitor and calibrated by spectroscopic ellipsometry.

The device performance of the sample OPV devices were measured in a nitrogen glovebox with <1.0 ppm $O_2$ and <0.1 ppm $H_2O$ by an Agilent semiconductor parameter analyzer under illumination by a 150 W Xe lamp with AM1.5 G filters (Oriel). Lamp intensity was varied by using neutral density filters and measured using an NREL-calibrated Si photodiode. Incident light intensity was determined by using the spectral correction factor, determined from the lamp intensity and device and detector responsivities.

Experimental Results:

Single-layer "sandwich-type" devices having the structure glass/ITO/MoO$_3$/Au were fabricated. The current-voltage (I-V) characteristics of these devices were measured and the resistivity ($\rho$=RA/t) was calculated, where R is the resistance, A is the device area, and t is the layer thickness, by using the Mott-Gurney relation:

$$I = \frac{V}{R} + \frac{9A\varepsilon\mu V^2}{8t^3}$$

Figure 6:
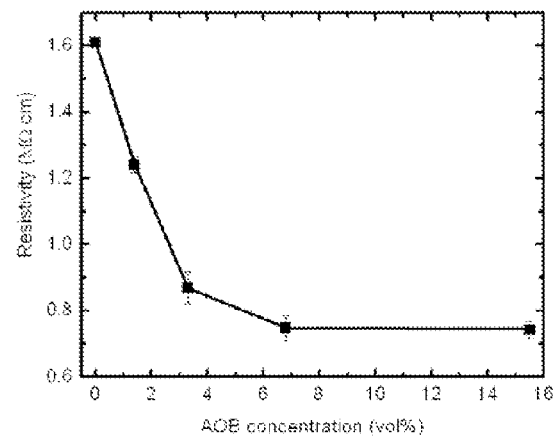
FIG. 6 Resistivity of $MoO_3$ films doped with AOB, measured from $ITO/MoO_3:AOB/Au$ sandwich-type devices.
Figure 7A:
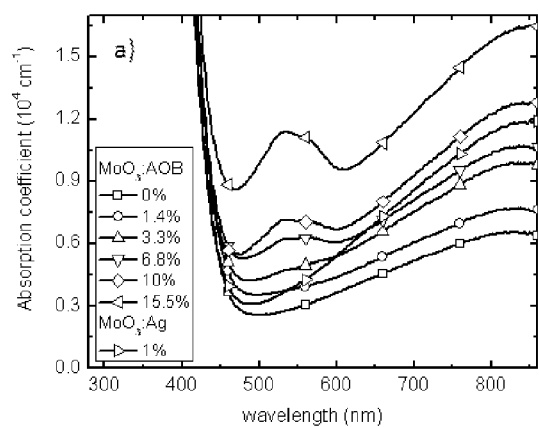
FIGS. 7a and 7b show absorption coefficients of various doped $MoO_3$ films deposited on quartz.
Figure 7B:
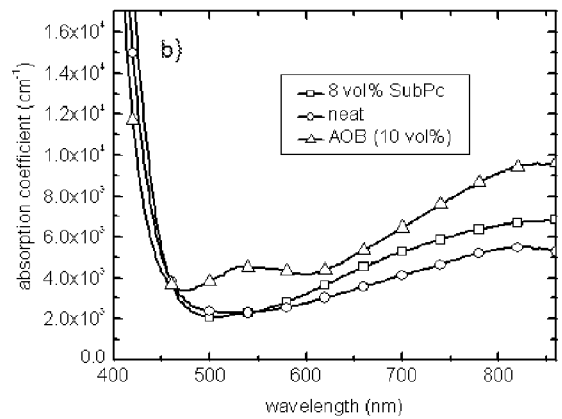

First, the I-V characteristics of 90 nm MoO$_3$ layers doped with various concentrations of AOB were measured. As shown in FIG. 6, for the neat MoO$_3$ film, the resistivity $\rho$ was 1.6 MΩcm and decreased to below 800 kΩcm when the MoO$_3$ film was doped with 7 vol. % AOB. Next, the absorption coefficient $\alpha$ of the doped metal oxide films was measured. As seen in FIGS. 7a and 7b, increased doping led to increased $\alpha$ at longer wavelengths. Additionally, the emergence of a new absorption peak at higher doping concentrations of AOB appear near 530 nm. This absorption does not correspond to that of neat AOB, but may reflect energy transfer from the organic dopant to the metal oxide host. This new absorption peak near 530 nm does not appear when doping with SubPc, indicating that energy transfer is not occurring.

Next, the doped MoO$_3$ films were incorporated into sample OPV devices. The device structure consisted of glass/ITO/40 nm MoO$_3$:dopant/9 nm MoO$_3$/13 nm SubPc/40 nm C$_{60}$/8 nm bathocuproine (BCP)/100 nm Ag. A control device with no MoO$_3$ layers was also included for comparison. The dopants in these working OPV examples were AOB, F$_4$TCNQ or SubPc, as compared to the control without any dopant, or the MoO$_3$ film doped with silver. The 9 nm MoO$_3$ buffer layer was incorporated into the sample devices to ensure that the organic dopants in the 40 nm MoO$_3$ are not affecting MoO$_3$/SubPC interface (e.g. causing exciton quenching, etc.). The inventors have found that this is not a problem.

Figure 8A:
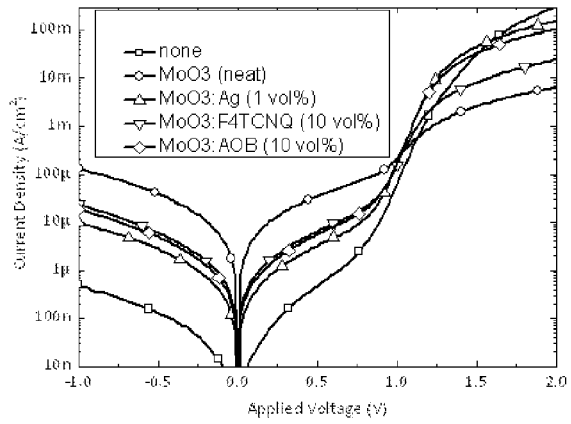
FIGS. 8a and 8b show dark (8a) and one-sun illuminated (8b) plots of the J-V characteristics of OPVs incorporating $MoO_3$ layers doped with Ag, $F_4TCNQ$, and AOB.
Figure 8B:
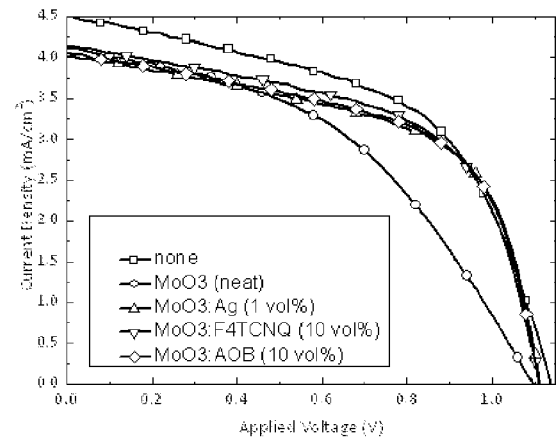

FIGS. 8a and 8b show the dark (8a) and one-sun illuminated (8b) plots of the J-V characteristics of these sample OPV devices incorporating MoO$_3$ layers doped with Ag, F$_4$TCNQ, and AOB. R$_s$ was then calculated from the dark J-V curves at forward bias by using a simplified version of the ideal diode equation, $J=J_s\{\exp[q(V-JR_s)/nk_bT]-1\}$, where J$_s$ is the reverse saturation current, q is the electron charge, n is the ideality factor, $k_b$ is Boltzmann's constant, and T is absolute temperature.

Table I summarizes the results of the calculated Rs of the OPVs from these undoped and doped MoO$_3$ layers. While Rs increases from 112±1 Ωcm$^2$ for undoped case, it is reduced to 4.3±0.1 Ωcm$^2$ when doped with 1 vol. % Ag and reduced to 6.5±0.1 Ωcm$^2$ when doped with 10 vol. % AOB, which is near the value of 4.4±3 Ωcm$^2$ obtained without a MoO$_3$ layer. R$_S$ also decreases when F$_4$TCNQ is used, though to a lesser degree—this is unexpected, as F$_4$TCNQ is typically used as a p-type dopant for organic materials and MoO$_3$ is considered by most to be an n-type material. It is possible that, because the ionization potential of MoO$_3$ is larger, F$_4$TCNQ in this case is acting as a weak n-type dopant.

TABLE I

Comparison of the series resistance for OPVs with different buffer layers.

| Buffer | Dopant | Ratio (vol %) | R$_S$ (Ωcm$^2$) |
|---|---|---|---|
| None | n/a | n/a | 4.4 ± 0.3 |
| MoO$_3$ | None | 0 | 112 ± 1 |
| MoO$_3$ | Ag | 1 | 4.3 ± 0.1 |
| MoO$_3$ | F$_4$TCNQ | 10 | 29.8 ± 0.4 |
| MoO$_3$ | AOB | 10 | 6.5 ± 0.1 |
| MoO$_3$ | SubPc | 4 | 70.7 ± 0.3 |

Figure 9A:
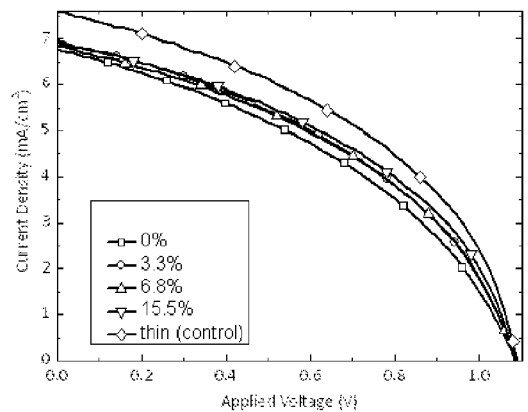
FIGS. 9a and 9b show one-sun illuminated J-V characteristics (9a) and performance parameters (9b) of OPV devices as a function of AOB doping concentration.
Figure 9B:
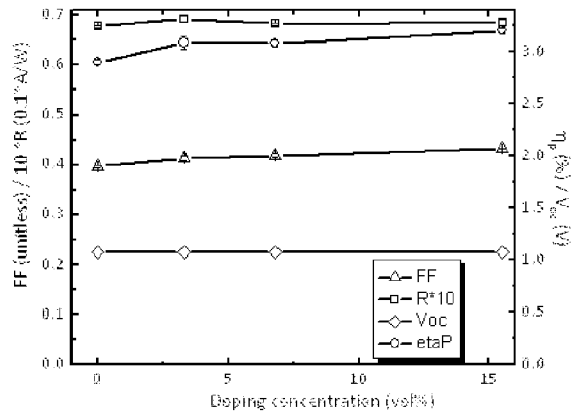
Figure 10A:
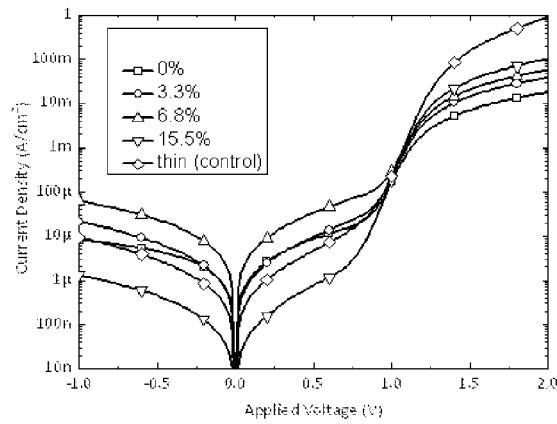
FIGS. 10a and 10b show dark J-V characteristics (10a) and series resistance (10b) of OPV devices as a function of AOB doping concentration.
Figure 10B:
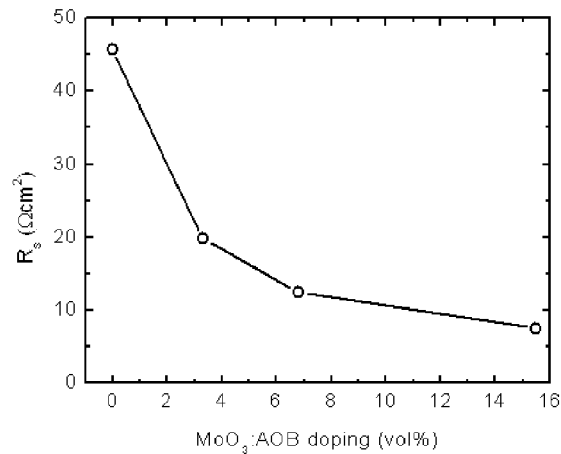

Similar OPV devices were fabricated with 90 nm MoO$_3$ layers and varying concentrations of AOB as the dopant. FIGS. 9a, 9b show one-sun illuminated J-V characteristics (9a) and performance parameters (9b) of the sample OPV devices as a function of AOB doping concentration. As shown in FIGS. 10a, 10b, Rs decreased from 46 Ωcm$^2$ for the neat case to 8 Ωcm$^2$ for 15.6 vol. % AOB.

Figure 11A:
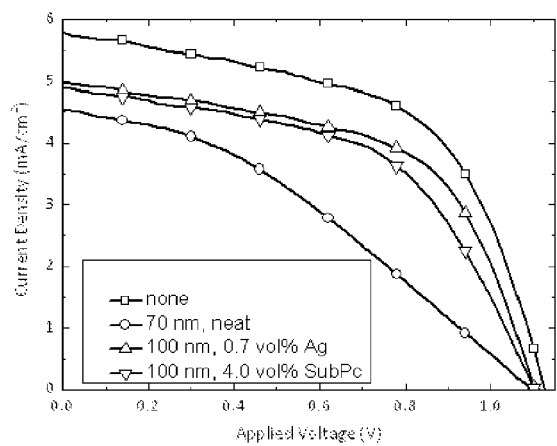
FIGS. 11a and 11b show one-sun illuminated J-V characteristics (11a) and performance parameters (11b) of OPV devices comparing different buffer layers.
Figure 11B:
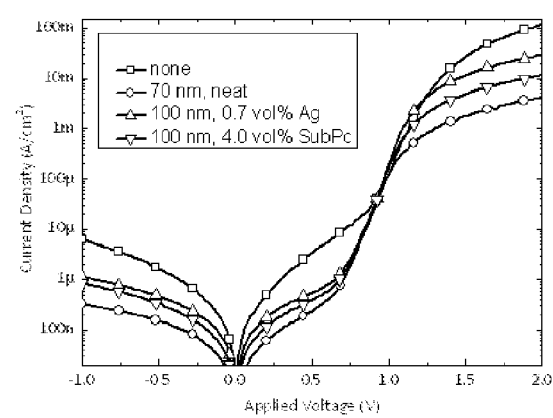

Similar devices were also fabricated using SubPc as the dopant. In this case, a thick MoO$_3$ layer was doped with 0.7 vol. % Ag, 4.0 vol. % SubPc, or undoped. FIGS. 11a, 11b show the performance of such device. The doping with SubPc doping increases the device performance, compared to the undoped case.

The use of metal oxide doped with organic compounds is likely to be beneficial in other devices. For example, metal oxide films doped with organic molecules could be used for either the hole-transport layer, the electron transport layer, or both.

It may also be possible to dope oxide films which are deposited from solution. Although all data shown here utilizes MoO$_3$ deposited by vacuum thermal evaporation, it is also possible to deposit MoO$_3$ from solution via spincasting, spray coating, doctor-blading, or other techniques. Doping of oxide films deposited from solution with organic molecules is also possible, if a solvent is chosen which both materials are soluble in.

The foregoing description and examples have been set forth merely to illustrate the invention and are not intended to be limiting. Each of the disclosed aspects and embodiments of the present disclosure may be considered individually or in combination with other aspects, embodiments, and variations of the invention. In addition, unless otherwise specified, none of the steps of the methods of the present disclosure are confined to any particular order of performance. Modifications of the disclosed embodiments incorporating the spirit and substance of the invention may occur to persons skilled in the art and such modifications are within the scope of the present invention.

Those skilled in the art may appreciate that changes could be made to the embodiments described above without departing from the broad inventive concept thereof. It is understood, therefore, that this invention is not limited to the particular embodiments disclosed, but it is intended to cover modifications within the spirit and scope of the present invention as defined by the attached claims.

What is claimed is:

1. A transparent metal oxide charge transport material for use in an optoelectronic device, the charge transport material comprising:
    a metal oxide material doped with an organic dopant material, wherein the organic dopant material is selected from the group consisting of acridine orange base (AOB), and chloroboron subphthalocyanine (SubPc),
    wherein the metal oxide material is doped with 1 to 20 vol. % of the organic dopant material, whereby electrical resistivity of the metal oxide material is reduced while maintaining transparency of the metal oxide charge transport material.

2. The metal oxide charge transport material of claim 1, wherein the metal oxide material is selected from the group consisting of $MoO_3$, $CrO_3$, $V_2O_5$, $WO_3$, NiO, $Cr_3O_4$, $Cr_2O_3$, CuO, $RuO_2$, $TiO_2$, $Ta_2O_5$, $SnO_2$, and $Cu_2O$.

3. The metal oxide charge transport material of claim 1, wherein the HOMO of the organic dopant is similar to or smaller than the LUMO of the metal oxide material.

4. The metal oxide charge transport material of claim 1, wherein the LUMO of the organic dopant is similar to or larger than the HOMO of the metal oxide material.

5. The metal oxide charge transport material of claim 1, wherein the metal oxide material is doped with 10 vol. % of the organic dopant material.

6. An organic photosensitive device comprising:
    a first electrode;
    a second electrode;
    a photoactive region disposed between the first electrode and the second electrode; and
    a transparent charge transport layer disposed between the photoactive region and at least one of the first and second electrodes, wherein the charge transport layer comprises a metal oxide material doped with an organic dopant material,
    wherein the organic dopant material is selected from the group consisting of acridine orange base (AOB), and chloroboron subphthalocyanine (SubPc),
    wherein the metal oxide material is doped with 1 to 20 vol. % of the organic dopant material, whereby electrical resistivity of the metal oxide material is reduced while maintaining transparency of the metal oxide charge transport material.

7. The device of claim 6, wherein the metal oxide material is selected from the group consisting of $MoO_3$, $CrO_3$, $V_2O_5$, $WO_3$, NiO, $Cr_3O_4$, $Cr_2O_3$, CuO, $RuO_2$, $TiO_2$, $Ta_2O_5$, $SnO_2$, and $Cu_2O$.

8. The device of claim 6, wherein the HOMO of the organic dopant is similar to or smaller than the LUMO of the metal oxide material.

9. The device of claim 6, wherein the LUMO of the organic dopant is similar to or larger than the HOMO of the metal oxide material.

10. The device of claim 6, wherein the metal oxide material is doped with 10 vol. % of the organic dopant material.

11. The device of claim 6, wherein the photoactive region comprises an organic donor material and an organic acceptor material forming a donor-acceptor heterojunction.

12. An organic photosensitive device comprising:
    an anode;
    multiple subcells in series, each subcell comprising:
        an electron donor layer, and an electron acceptor layer in contact with the electron donor layer forming a donor-acceptor heterojunction, an electron-hole recombination zone separating the subcells; and
    a cathode,
    wherein the electron-hole recombination zone comprises a transparent metal oxide material doped with an organic dopant material, wherein the organic dopant material is selected from the group consisting of acridine orange base (AOB), and chloroboron subphthalocyanine (SubPc),
    wherein the metal oxide material is doped with 1 to 20 vol. % of the organic dopant material, whereby electrical resistivity of the metal oxide material is reduced while maintaining transparency of the metal oxide material.

13. The device of claim 12, wherein the metal oxide material is selected from the group consisting of $MoO_3$, $CrO_3$, $V_2O_5$, $WO_3$, NiO, $Cr_3O_4$, $Cr_2O_3$, CuO, $RuO_2$, $TiO_2$, $Ta_2O_5$, $SnO_2$, and $Cu_2O$.

14. The device of claim 12, wherein the HOMO of the organic dopant is similar to or smaller than the LUMO of the metal oxide material.

15. The device of claim 12, wherein the LUMO of the organic dopant is similar to or larger than the HOMO of the metal oxide material.

16. The device of claim 12, wherein the metal oxide material is doped with 10 vol. % of the organic dopant material.

17. An organic light emitting device comprising:
    an anode;
    a cathode; and
    at least one emissive layer and at least one transparent charge transport layer disposed between the anode and the cathode, wherein the at least one charge transport layer comprises a metal oxide material doped with an organic dopant material, wherein the organic dopant material is selected from the group consisting of acridine orange base (AOB), and chloroboron subphthalocyanine (SubPc),
    wherein the metal oxide material is doped with 1 to 20 vol. % of the organic dopant material, whereby electrical resistivity of the charge transport layer is reduced while maintaining transparency of the charge transport layer.

18. The device of claim 17, wherein the metal oxide material is selected from the group consisting of $MoO_3$, $CrO_3$, $V_2O_5$, $WO_3$, NiO, $Cr_3O_4$, $Cr_2O_3$, CuO, $RuO_2$, $TiO_2$, $Ta_2O_5$, $SnO_2$, and $Cu_2O$.

19. The device of claim 17, wherein the HOMO of the organic dopant is similar to or smaller than the LUMO of the metal oxide material.

20. The device of claim 17, wherein the LUMO of the organic dopant is similar to or larger than the HOMO of the metal oxide material.

21. The device of claim 17, wherein the metal oxide material is doped with 10 vol. % of the organic dopant material.

22. The device of claim 17, wherein the at least one charge transport layer is an electron transport layer in direct contact with the at least one emissive layer and disposed between the at least one emissive layer and the cathode.

23. The device of claim 17, wherein the at least one charge transport layer is a hole transport layer in direct contact with the at least one emissive layer and disposed between the at least one emissive layer and the anode.

24. A stacked organic light emitting device comprising:
    an anode;
    a cathode;
    a plurality of emissive regions disposed between the anode and the cathode; and
    a transparent charge generation layer disposed between successive emissive regions, wherein the charge generation layer comprises a metal oxide material doped with an organic dopant material, wherein the organic dopant material is selected from the group consisting of, acridine orange base (AOB), and chloroboron subphthalocyanine (SubPc),
    wherein the metal oxide material is doped with 1 to 20 vol. % of the organic dopant material, whereby electrical resistivity of the charge generation layer is reduced while maintaining transparency of the charge generation layer.

25. The device of claim 24, wherein the metal oxide material is selected from the group consisting of $MoO_3$, $CrO_3$, $V_2O_5$, $WO_3$, NiO, $Cr_3O_4$, $Cr_2O_3$, CuO, $RuO_2$, $TiO_2$, $Ta_2O_5$, $SnO_2$, and $Cu_2O$.

26. The device of claim 24, wherein the HOMO of the organic dopant is similar to or smaller than the LUMO of the metal oxide material.

27. The device of claim 24, wherein the LUMO of the organic dopant is similar to or larger than the HOMO of the metal oxide material.

28. The device of claim 24, wherein the metal oxide material is doped with 10 vol. % of the organic dopant material.

29. The device of claim 24, wherein the at least one charge transport layer is an electron transport layer in direct contact with the at least one emissive layer and disposed between the at least one emissive layer and the cathode.

30. The device of claim 24, wherein the at least one charge transport layer is a hole transport layer in direct contact with the at least one emissive layer and disposed between the at least one emissive layer and the anode.

31. The device of claim 6, wherein the charge transport layer has a thickness of 150 nm or higher.

32. The device of claim 12, wherein the metal oxide material has a thickness of 150 nm or higher.

33. The device of claim 24, wherein the at least one charge transport layer has a thickness of 150 nm or higher.

34. The device of claim 24, wherein the charge generation layer has a thickness of 150 nm or higher.

* * * * *